(12) United States Patent
Kwon et al.

(10) Patent No.: US 6,602,588 B1
(45) Date of Patent: Aug. 5, 2003

(54) SUPERCONDUCTING STRUCTURE INCLUDING MIXED RARE EARTH BARIUM-COPPER COMPOSITIONS

(75) Inventors: Chuhee Kwon, Long Beach, CA (US); Quanxi Jia, Los Alamos, NM (US); Stephen R. Foltyn, Los Alamos, NM (US); James L. Smith, Los Alamos, NM (US); Eric J. Peterson, Los Alamos, NM (US); William Larry Hults, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/787,225

(22) PCT Filed: Sep. 14, 1999

(86) PCT No.: PCT/US99/20949

§ 371 (c)(1), (2), (4) Date: Mar. 14, 2001

(87) PCT Pub. No.: WO00/22652

PCT Pub. Date: Apr. 20, 2000

Related U.S. Application Data (60) Provisional application No. 60/100,215, filed on Sep. 14, 1998.

(51) Int. Cl.$^7$ .............................. B32B 7/02; B32B 9/00
(52) U.S. Cl. ....................... 428/216; 428/699; 428/702; 505/125; 505/126
(58) Field of Search ................................ 428/216, 697, 428/699, 701, 702; 505/234, 125, 126, 230, 807, 779, 780

(56) References Cited

U.S. PATENT DOCUMENTS

| | | | | |
|---|---|---|---|---|
| 4,983,570 A | * | 1/1991 | Creuzet et al. | 427/62 |
| 5,106,823 A | * | 4/1992 | Creuzet et al. | 257/33 |
| 5,428,005 A | * | 6/1995 | Matsuura et al. | 428/688 |
| 5,525,584 A | * | 6/1996 | Murakami et al. | 252/519.1 |
| 5,529,980 A | * | 6/1996 | Gupta | 428/688 |
| 5,593,950 A | * | 1/1997 | Mukaida et al. | 257/33 |
| 5,612,292 A | * | 3/1997 | Gupta | 427/419.3 |
| 5,712,227 A | * | 1/1998 | Higaki et al. | 428/701 |
| 5,793,092 A | * | 8/1998 | Habermeier et al. | 257/22 |
| 5,869,431 A | * | 2/1999 | Veal et al. | 427/62 |
| 5,920,246 A | * | 7/1999 | Nagashima et al. | 335/216 |
| 5,998,050 A | * | 12/1999 | Yamada et al. | 428/700 |
| 6,121,205 A | * | 9/2000 | Murakami et al. | 156/89.11 |

FOREIGN PATENT DOCUMENTS

DE 4434904 A1 * 6/1996
GB 2314076 A * 12/1997

OTHER PUBLICATIONS

Schatzle et al., "Melt processing of (Nd,Y)BaCuO and (Sm,Y)BaCuO composites," Supercond. Sci. Technol., 1996, 9, pp. 869–874.*

Saitoh et al., "Microstructures and superconducting properties of melt–processed (RE,RE')–Ba–Cu–0,"Physica C 288, 1997, pp. 141–147.*

Matthres et al., "Melt–textured growth and characterisation of a (Nd/Y)Ba2Cu3O(7–beta) composite superconductor with very high critical current density," Physica C 249 (1995), pp. 255–261.*

Habermeier et al., "Laser–induced voltages at room temperature in Pr doped Y–Ba–Cu–O thin films," Ins. Phys. Conf. Ser. No. 148, 1995, pp. 1023–1026.*

* cited by examiner

*Primary Examiner*—Tom Dunn
*Assistant Examiner*—Colleen P. Cooke
(74) *Attorney, Agent, or Firm*—Bruce H. Cottrell (57) ABSTRACT

A superconductive structure including a dielectric oxide substrate and a thin layer of a rare earth-barium-copper oxide superconducting film thereon, the thin layer including at least two rare earth elements is provided.

8 Claims, 8 Drawing Sheets

SUPERCONDUCTING STRUCTURE INCLUDING MIXED RARE EARTH BARIUM-COPPER COMPOSITIONS

This application claims the benefit of provisional application 60/100,215 filed Sep. 14, 1998.

FIELD OF THE INVENTION

The present invention relates to superconducting structures and to a method of improving superconducting flux pinning properties of selected mixed ($RE^1/RE^2$) $Ba_2Cu_3O_7$ films, where $RE^1$ and $RE^2$ are selected rare earth elements. This invention was made with government support under Contract No. W-7405-ENG-36 awarded by the U.S. Department of Energy. The government has certain rights in the invention.

BACKGROUND OF THE INVENTION

Since the discovery of high-temperature superconducting (HTS) materials (superconducting above the liquid nitrogen temperature of 77 K) there have been efforts to research and develop various technology and engineering applications using such HTS materials. In thin film superconductor devices, the most progress has been made with fabrication of devices utilizing an oxide superconductor including yttrium, barium, copper and oxide in the well-known basic composition of $YBa_2Cu_3O_{7-x}$ (hereinafter referred to as Y123). At liquid nitrogen temperatures and in high magnetic fields, the $J_c$ of Y123 is superior to those of the bismuth, thallium and mercury based HTS materials. Thus, Y123 has been the preferred material for many applications.

Even though Y123 is the material of choice for HTS applications, it has drawbacks. One drawback is that Y123 has one of the lowest $T_c$'s among $(RE)Ba_2Cu_3O_{7-x}$ materials (hereinafter referred to as (RE)123) which can limit $J_c$ at the liquid nitrogen temperature (since $J_c$ depends on $T_c$; $J_c \approx (1-T/T_c)^{3/2}$). Still another drawback is that other RE123 materials such as Nd123 have a larger $J_c$ in high magnetic fields than Y123. Hence, it has been important to continue development of (RE)123 films for various HTS applications.

There have also been several efforts at combining mixed rare earth elements in bulk materials to improve flux pinning. For example, Matthews et al., Physica C, vol. 249, pp. 255–261 (1995) describe increased $J_c$ for bulk samples of $(Nd_{1-y}Y_y)123$ in magnetic fields comparison to Y123 samples. Schaetzle et al., Supercond. Sci. Technol., vol. 9, pp. 869–874 (1996) describe the preparation of bulk samples of $(Sm_{1-y}Y_y)123$ and $(Nd_{1-y}Y_y)123$. Schaekle et al. show higher $J_c$'s for $(Nd_{1-y}Y_y)123$ than Y123 in a magnetic field, but show that $(Sm_{1-y}Y_y)123$ has lower $J_c$'s than Y123 in a magnetic field. Saitoh et al., Physica C, vol. 288, pp. 141–147 (1997) describe $J_c$'s in a magnetic field for (RE, RE')123's where RE and RE' are rare earth elements from the group of yttrium, neodymium, europium, gadolinium and sarmarium.

Despite the variety of work with bulk materials, there have been no know attempts at forming thin films of mixed rare earth element containing 123 compositions. Thus, an object of the present invention is thin film compositions of various ($RE^1/RE^2$)123 films.

Another object of the present invention is a process of forming various ($RE^1/RE^2$)123 thin films with enhanced flux pinning properties by forming multilayer compositions with alternating layers of ($RE^1$)123 and ($RE^2$)123 films.

SUMMARY OF THE INVENTION

To achieve the foregoing and other objects, and in accordance with the purposes of the present invention, as embodied and broadly described herein, the present invention provides a superconductive structure including a substrate and a thin layer of a superconducting rare earth-barium-copper.oxide ((RE)123) film thereon, the thin layer including at least two rare earth elements ($RE^1$ and $RE^2$).

The present invention also provides a method of improving the superconducting flux pinning properties of a superconducting (rare-earth)-barium-copper oxide structure by forming alternating thin film layers including at least a first thin layer of a first rare earth-barium-copper oxide (($RE^1$)123) film directly on a substrate and forming a second thin layer of a second rare earth-barium-copper oxide (($RE^2$)123) film.

DETAILED DESCRIPTION

Figure 1:
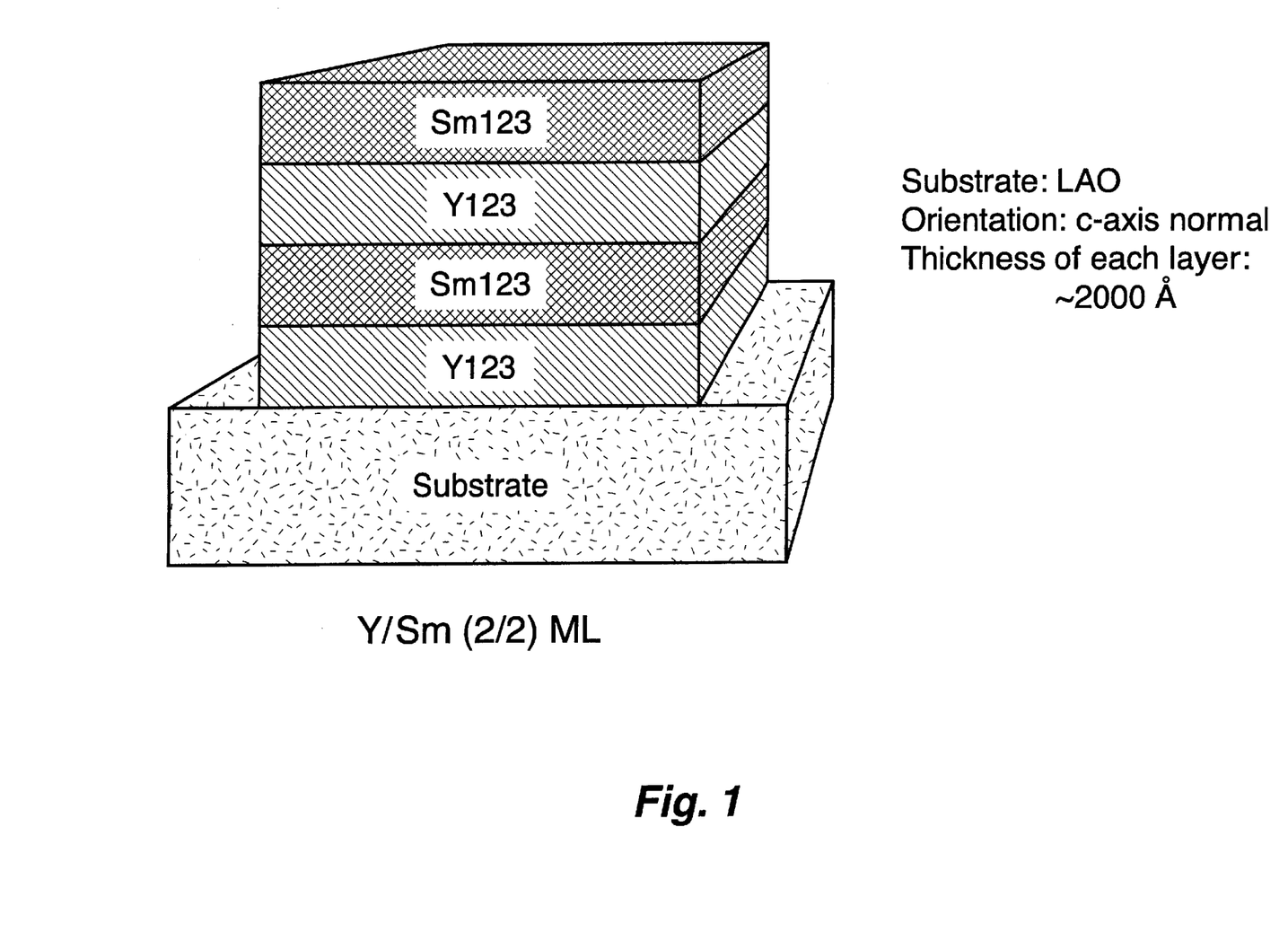
FIG. 1 shows a schematic structure of one embodiment of the superconducting structure of the present invention.

The present invention is concerned with thin film superconducting compositions with improved flux pinning properties. In one embodiment of the present invention, a thin film superconducting composition includes a multilayer structure with alternating layers of $(RE^1)123$ and $(RE^2)123$ materials as shown in FIG. 1. In another embodiment of the present invention a thin film superconducting composition includes $(RE^1/RE^2)123$.

In forming the thin film superconducting compositions of the present invention, thin films of the rare earth element containing compositions are generally deposited upon a base substrate. The base substrate can be a dielectric oxide such as lanthanum aluminum oxide ($LaAlO_3$), strontium titanate ($SrTiO_3$), magnesium oxide (MgO), strontium aluminum tantalum oxide ($Sr_2AlTaO_6$) or a solid solution of lanthanum aluminum oxide and strontium aluminum tantalum oxide ($(LaAlO_3)_{0.3}(Sr_2AlTaO_6)_{0.7}$ and neodymium gadolinate ($NdGaO_3$), or can be a composite material such as cerium oxide with a buffer layer of yttria-stabilized zirconia ($CeO_2/YSZ$), aluminum oxide with a buffer layer of cerium oxide ($Al_2O_3/CeO_2$) or silicon with a buffer layer. The base substrate may also be a composite including a flexible metallic substrate such as nickel, nickel-alloys and the like with a suitable buffer layer upon the metal surface, such a buffer layer preferably being a material such as YSZ or MgO deposited by ion beam assisted deposition. Ion beam assisted deposition is described in U.S. Pat. No. 5,650,378, U.S. Pat. No. 5,432,151, and U.S. Pat. 5,872,080.

The thin films of rare earth element containing materials are generally from about 5 nanometers (nm) to about 500 nm in thickness, preferably from about 10 nm to about 200 nm. In the multilayer structures of the present invention, each individual layer can generally be from about 5 nanometers (nm) to about 500 nm in thickness, preferably from about 10 nm to about 200 nm, more preferably about 200 nm. Other variations of the film thicknesses may be used as well as would be readily apparent to one skilled in the art.

It is generally preferably that the thin film of (RE)123 material, e.g., superconducting (RE)123 material, has chemical and structural compatibility with other materials in the structure. By "chemical compatibility" is meant that the various $(RE^1)123$ and $(RE^2)123$ materials do not undergo property degrading chemical interactions between alternating layers or with the substrate. By "structural compatibility" is meant that the $(RE^1)123$ and $(RE^2)123$ materials have a substantially similar lattice structure between alternating layers or with the substrate. Well known buffer layers can be used between the substrate and the (RE)123 materials to assure chemical and structural compatibility.

Among the various materials suitable in forming the high temperature superconducting (HTS) compositions of the present invention can be any of the rare-earth-barium copper oxides ($RE-Ba_2Cu_3O_7$ or RE-BCO), with the rare earth elements (e.g., $RE^1$ and $RE^2$) being from the group of yttrium, praseodymium, neodymium, promethium, samarium, europium, gadolinium, terbium, dysprosium, holmium, erbium, thulium, ytterbium, and lutetium. Suitable binary combinations of the rare earth elements may then include yttrium and praseodymium, yttrium and neodymium, yttrium and promethium, yttrium and samarium, yttrium and europium, yttrium and gadolinium, yttrium and terbium, yttrium and dysprosium, yttrium and holmium, yttrium and erbium, yttrium and thulium, yttrium and ytterbium, yttrium and lutetium, praseodymium and neodymium, praseodymium and promethium, praseodymium and samarium, praseodymium and europium, praseodymium and gadolinium, praseodymium and terbium, praseodymium and dysprosium, praseodymium and holmium, praseodymium and erbium, praseodymium and thulium, praseodymium and ytterbium, praseodymium and lutetium, neodymium and promethium, neodymiurm and samarium, neodymium and europium, neodymium and gadolinium, neodymium and terbium, neodymium and dysprosium, neodymium and holmium, neodymium and erbium, neodymium and thulium, neodymium and ytterbium, neodymium and lutetium, promethium and samarium, prorethium and europium, promethium and gadolinium, promethium and terbium, promethium and dysprosium, promethium and holinium, promethium and erbium, promethium and thulium, promethium and ytterbium, promethium and lutetium, samarium and europium, samarium and gadolinium, samarium and terbium, samarium and dysprosium, samarium and holmium, samarium and erbium, samarium and thulium, samarium and ytterbium, samarium and lutetium, europium and gadolinium, europium and terbium, europium and dysprosium, europium and holmiurm, europium and erbium, europium and thulium, europium and ytterbium, europium and lutetium, gadolinium and terbium, gadolinium and dysprosium, gadolinium and holmium, gadoliniumn and erbium, gadolinium and thulium, gadolinium and ytterbium, gadoliniurn and lutetium, terbium and dysprosium, terbium and holmium, terbium and erbium, terbium and thulium, terbium and ytterbium, terbium and lutetium, dysprosium and holmium, dysprosium and erbium, dysprosium and thulium, dysprosium and ytterbium, dysprosium and lutetium, holmium and erbium, holmium and thulium, holmium andytterbium, holmium and lutetium, erbium and thulium, erbium and ytterbium, erbium and lutetium, thulium and ytterbium, thulium and lutetium, and ytterbium and lutetium. Ternary and quaternary combinations may be used as well as may additional combinations including more than four of the individual rare earth elements.

In the combinations of two rare earth elements, it is preferred that each of the two rare earth elements are not present in equal mole percentages, i.e., 50 mole percent of each rare earth element. While each element may be present in a mole percent of generally from about 10 nm percent to about 90 percent, preferably from about 30 percent to about 70 percent, more preferably from about 45 percent to about 55 percent, based on the total amount of rare earth elements present, it is preferred to have unequal mole percentages present. In ternary and quatemary combinations, the mole percentages may vary widely although equal amounts may be most preferable.

The various rare earth element containing material layer or layers can be deposited by pulsed laser deposition or by other well known methods such as evaporation, sputtering, or chemical vapor deposition. Pulsed laser deposition is the preferred deposition method.

In pulsed laser deposition, powder of the desired material can be initially pressed into a disk or pellet under high pressure, generally above about 500 nm pounds per square inch (PSI) and the pressed disk then sintered in an oxygen-containing atmosphere for at least about one hour, preferably from about 12 to 24 hours. One common approach to preparing a target for pulsed laser deposition can involve grinding of the target materials, followed by sintering of the powder in, e.g., air, for from one half day up to five days at temperatures of from about 800° C. to about 1000° C. Several repeated grinding and sintering cycles can assure a well-mixed sample. Then, the materials can be pressed to complete the desired target. An apparatus suitable for the pulsed laser deposition is shown in Appl. Phys. Lett., 56, 578(1990), "Effects of beam parameters on excimer laser deposition of $YBa_2Cu_3O_{7-x}$", such description hereby incorporated by reference.

Suitable conditions for pulsed laser deposition include, e.g., the laser, such as a XeCI excimer laser (20 nanoseconds (ng), 308 nanometers (nm)), targeted upon a rotating pellet of the desired material at an incident angle of about 45°. The target substrate can be mounted upon a heated holder rotated at about 0.5 revolutions per minute (rpm) to minimize thickness variations in the resultant film or layer. The substrate can be heated during the deposition at temperatures from about 600° C. to about 950°C., preferably from about 700° C. to about 850°C., more preferably from about 700°C. to about 800°C. An oxygen atmosphere of from about 0.1 millitorr (mTorr) to about 10 Torr, preferably from about 10 mTorr to about 400 mTorr, can be maintained within the deposition chamber during the deposition. Distance between the substrate holder and the pellet can generally be from about 4 centimeters (cm) to about 10 cm.

The rate of formation of the thin films or layers can be varied from about 0.1 Angstrom per second (Å/s) to about 200 nm Å/s by changing the laser repetition rate from about 1 hertz (Hz) to about 200 Hz. As laser beam divergence is a function of the repetition rate, the beam profile can be monitored after any change in repetition rate and the lens focal distance adjusted to maintain a constant laser energy density upon the target pellet. Generally, the laser beam can have dimensions of about 3 millimeters (mm) by 4 mm with an average energy density of from about 1 to about 5 joules per square centimeter ($J/cm^2$), preferably from about 1.5 to about 3 $J/cm^2$.

Figure 2:
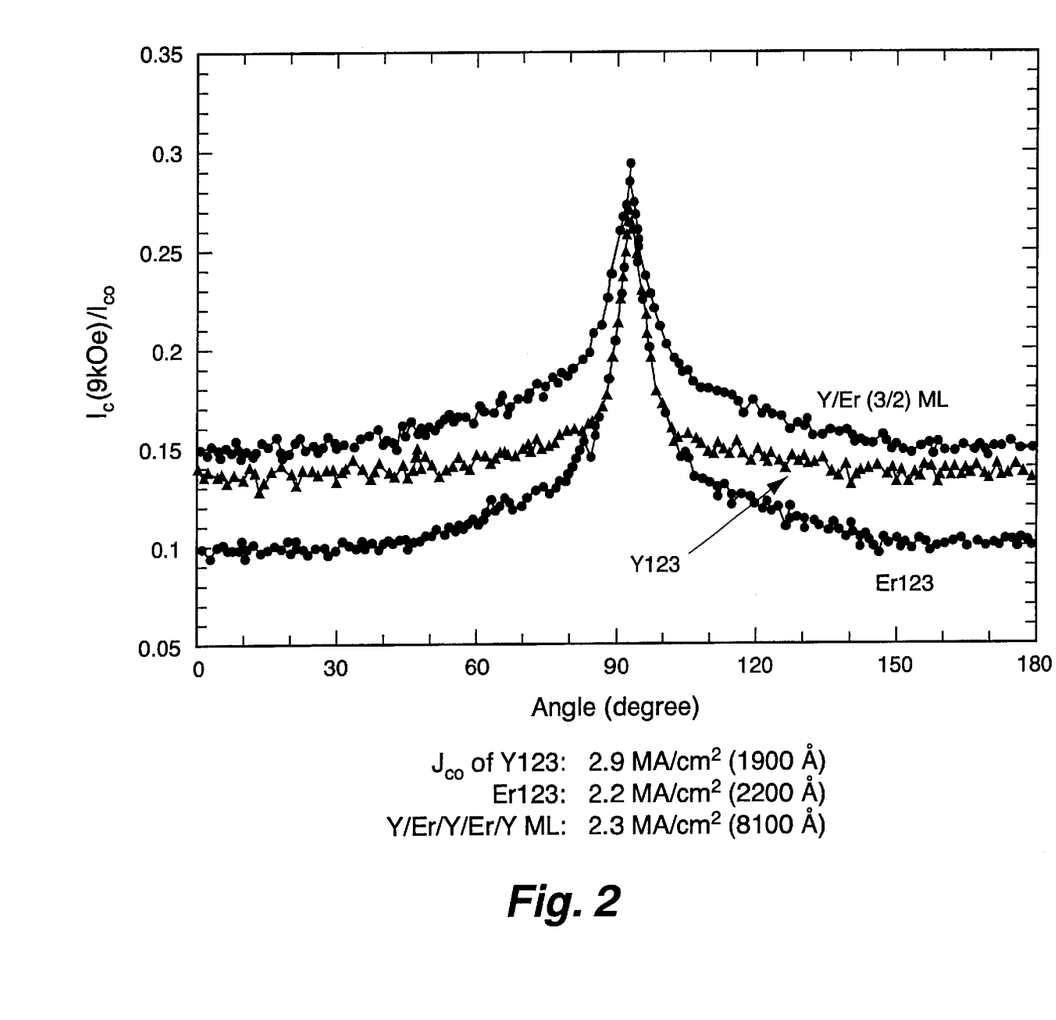
FIG. 2 shows a comparison of angle dependence ($I_c/I_{co}$) between a superconducting yttrium-barium-copper oxide film, a superconducting erbium-barium-copper oxide film and a multi layer of three layers of superconducting yttrium-barium-copper oxide alternating with two layers of superconducting erbium-barium-copper oxide in accordance with the present invention.
Figure 3:
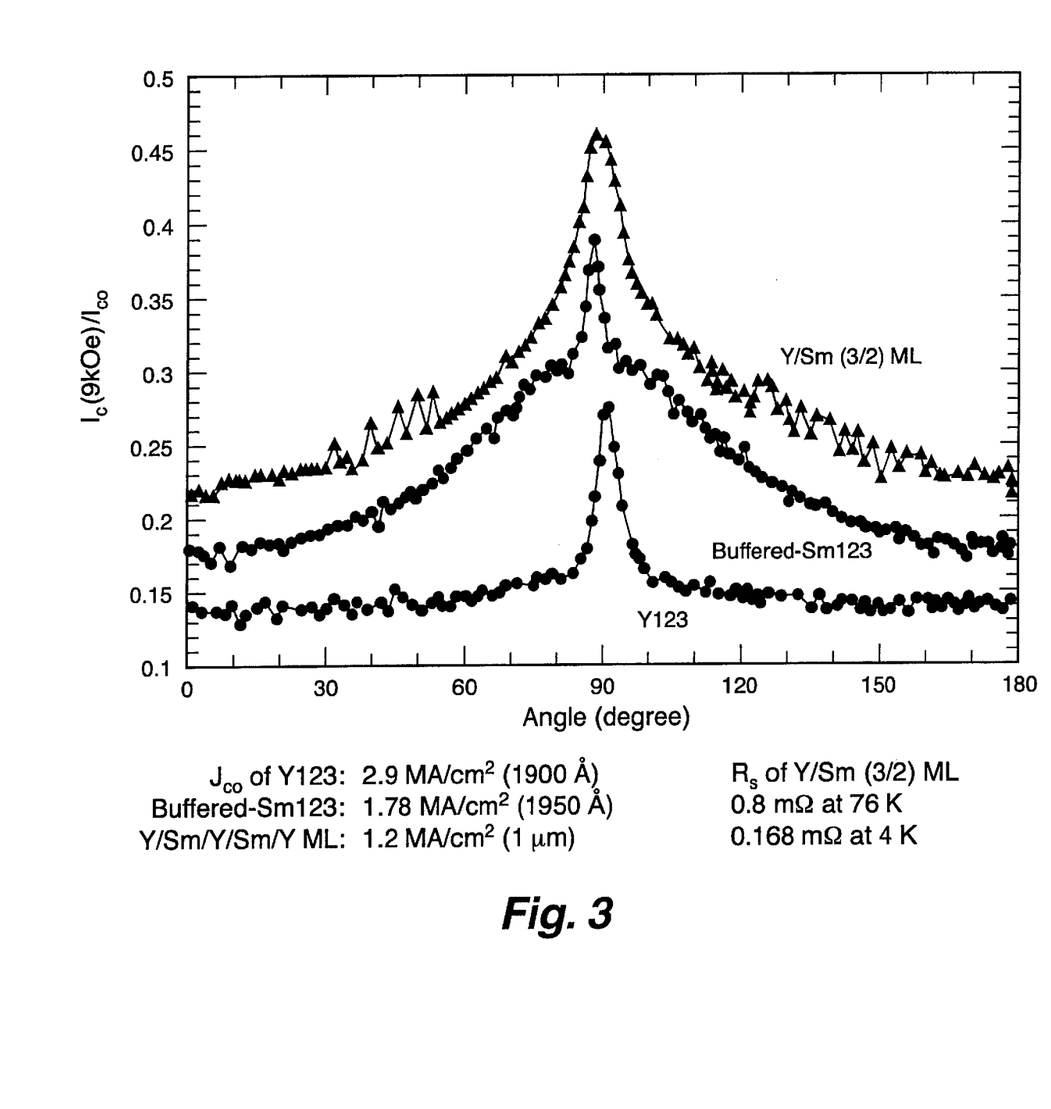
FIG. 3 shows a comparison of angle dependence ($I_c/I_{co}$) between a superconducting yttrium-barium-copper oxide film, a superconducting samarium-barium-copper oxide film including a single thin buffer layer of YBCO as taught by Kwon et al., in "Superconductive Structure", U.S. Ser. No. 09/152,813, filed Sep. 14, 1998, and a multilayer of three layers of superconducting yttrium-barium-copper oxide alternating with two layers of superconducting samarium-barium-copper oxide in accordance with the present invention.
Figure 4:
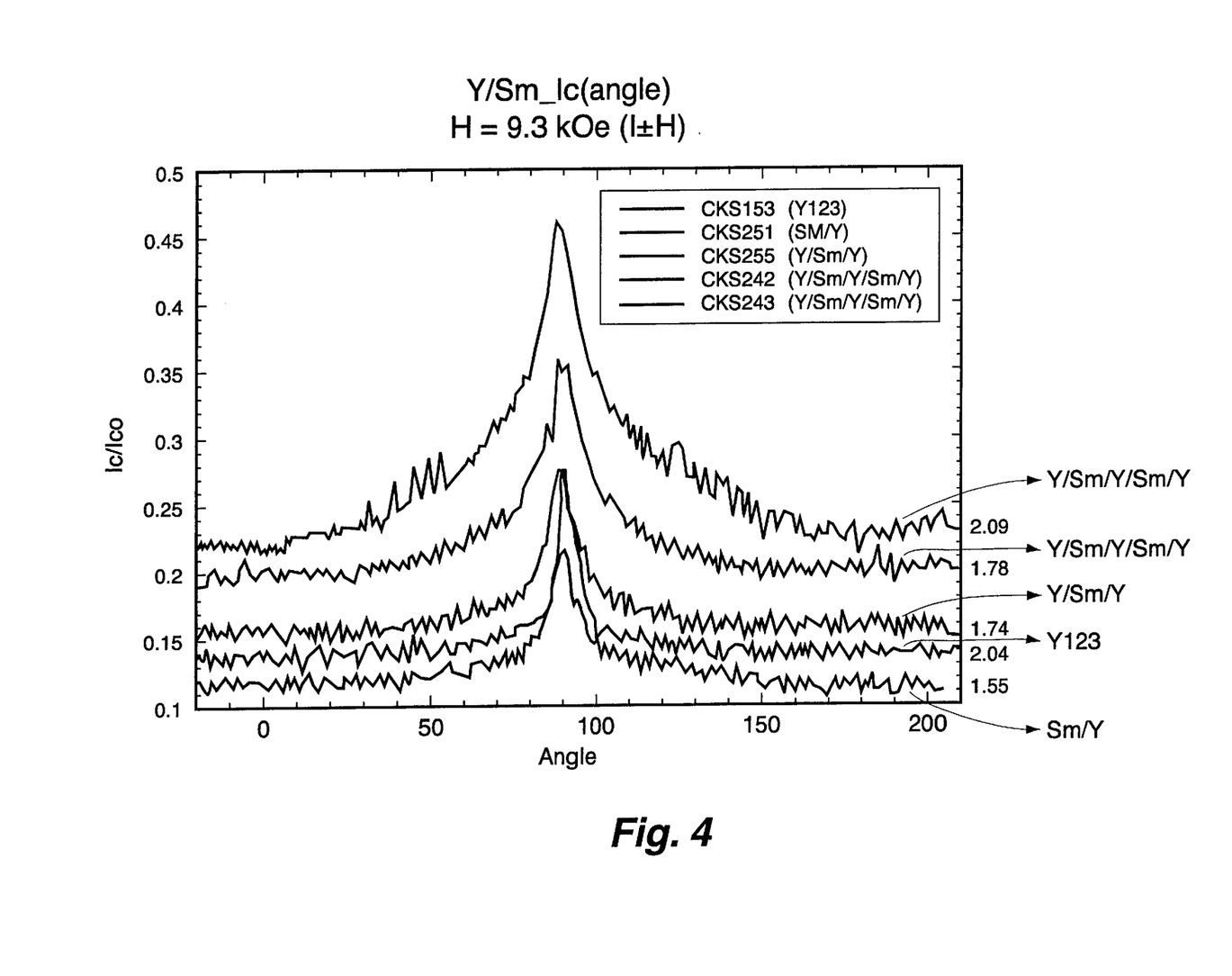
FIG. 4 shows a comparison of angle dependence ($I_c/I_{co}$) between: (1) a bilayer of superconducting samarium-barium-copper oxide film and superconducting yttrium-barium-copper oxide film; (2) a superconducting yttrium-barium-copper oxide film; (3) a superconducting trilayer of superconducting samarium-barium-copper oxide film sandwiched between two layers of superconducting yttrium-barium-copper oxide film; and, (4) a multilayer of three layers of superconducting yttrium-barium-copper oxide alternating with two layers of superconducting erbium-barium-copper oxide in accordance with the present invention.

By use of the multi layers of (RE1)-barium-copper oxide and ($RE^2$)-barium-copper oxide, the superconducting properties of composite (rare-earth)-barium-copper oxides ($RE^1RE^2$)123 can be improved. For example, a five layer multilayer structure with including two 2000 Å thick samarium-barium-copper oxide films each sandwiched between alternating 2000 Å thick layers of superconducting yttrium-barium-copper oxide showed improvements in angle dependence as shown in FIGS. 3 and 4. Similarly, a five layer multilayer structure with including two 2000 Å thick erbium-barium-copper oxide films each sandwiched between alternating 2000 Å thick layers of superconducting yttrium-barium-copper oxide showed improvements in angle dependence as shown in FIG. 2.

In the embodiment of the present invention employing multilayers of($RE^1$)barium-copper oxide and ($RE^2$)-barium-copper oxide, the individual layers may include more than one rare earth element. In that case, the ($RE^1$)-barium-copper oxide layer and the ($RE^2$)-barium-copper oxide may each include a binary rare earth combination, a ternary rare earth combination or a quaternary rare earth combination. The various binary combinations have been enumerated above and the ternary and quaternary combinations are readily recognized. The number of alternating layers is generally at least three. Also, more layers may be preferred. It has been found that five layers of alternating superconducting ($RE^1$)123 and superconducting ($RE^2$)123 materials can provide stronger pinning and improved $I_c(9kOe)I_{co}$ than three layers of alternating superconducting ($RE^1$)123 and superconducting ($RE^2$)123 materials. The number of alternating layers is not limited to odd numbers, but can be formed from four or six layers or the like. Generally, it may be preferred that the top layer of either ($RE^1$)123 or ($RE^2$)123 have the better superconducting properties between the materials. The composite multi layer structures of the present invention may also employ more than two different types of materials. That is, a ternary system may include a first layer of ($RE^1$)123, a second layer of ($RE^2$)123 and a third layer of ($RE^3$)123 with $RE^3$ selected from among the same materials as $RE^1$ and $RE^2$.

The present invention is more particularly described in the following examples, which are intended as illustrative only, since numerous modifications and variations will be apparent to those skilled in the art.

EXAMPLE 1

A series of structures with $LaAlO_3$ substrates were formed with alternating layers of first superconducting yttrium-barium-copper oxide and then superconducting samarium-barium-copper oxide films or superconducting erbium-barium-copper oxide films. The thin films were deposited onto the substrates by in situ pulsed laser deposition (PLD) using a 308 nm XeCI excimer laser under substantially the same processing conditions.

Study on properties of the structures of the present invention has compared a superconducting composite of superconducting samarium-barium-copper oxide film and superconducting yttrium-barium-copper oxide layer on. a substrate, with a superconducting yttrium-barium-copper oxide layer alone on a similar substrate. The superconducting composite showed stronger pinning and improved $I_c(9kOe)/I_{co}$, the normalized $I_c$ in fields (H=9kOe), as seen in FIG. 4. Similar results were obtained for a superconducting composite of superconducting erbium-barium-copper oxide film and superconducting yttrium-barium-copper oxide layer on a substrate. As seen in FIG. 2 where the composite included a five layer composite with alternating layers of yttrium-barium-copper oxide layers (three) and layers of erbium-barium-copper oxide layers (two).

These results demonstrate that such multi layer superconducting composites can achieve improved $J_c$ properties for a rare earth-barium-copper oxide composite including alternating layers such as samarium-barium-copper oxide layers and yttrium-barium-copper oxide layer or as erbium-barium-copper oxide layers and yttrium-barium-copper oxide layers.

EXAMPLE 2

Figure 5:
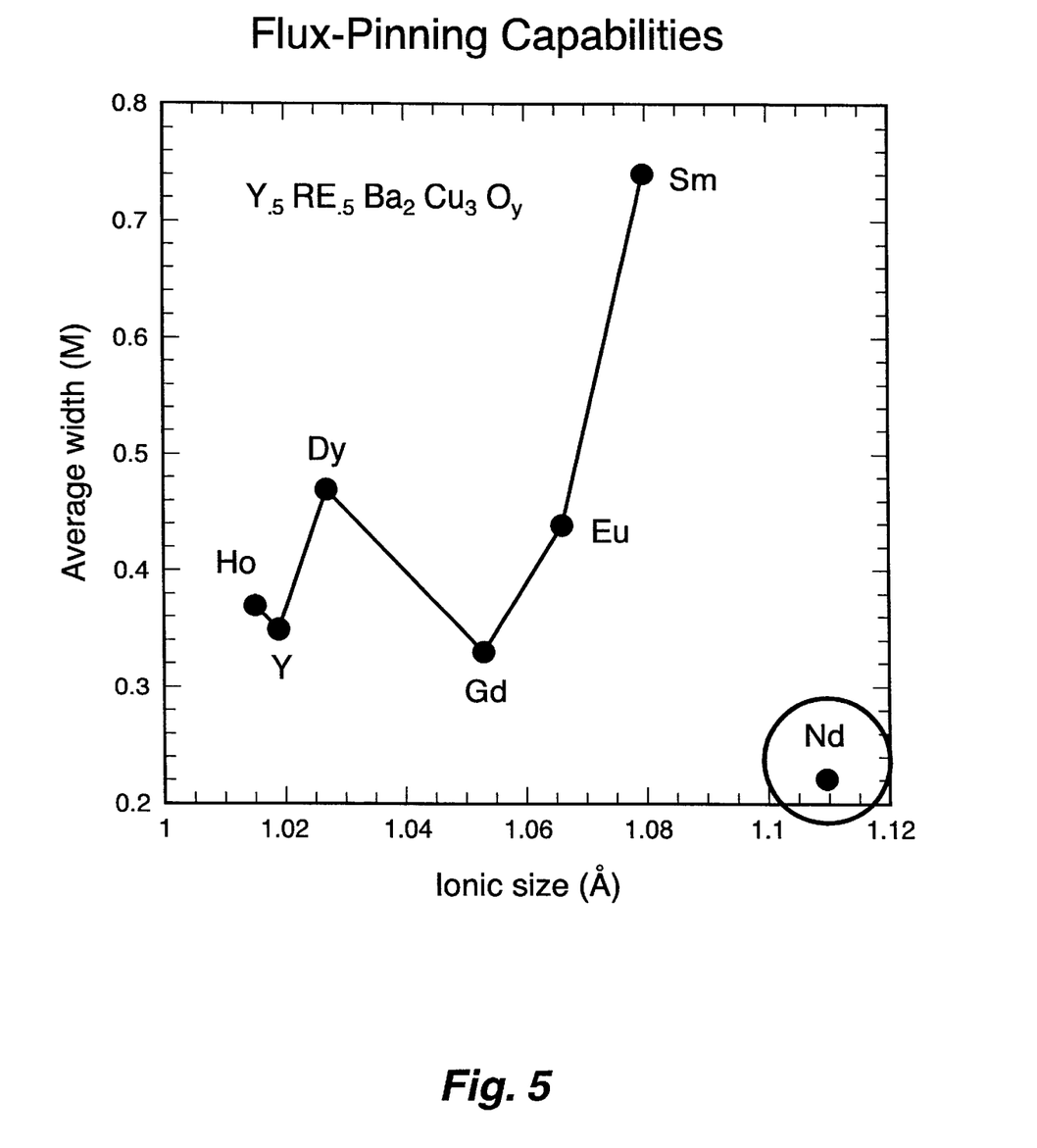
FIG. 5 shows a plot of average width of the hysteresis loop plotted against ionic radius size of selected rare earth element cation combinations, e.g., ($RE^1RE^2$)123 compositions, to show flux pinning capabilities.

Bulk samples of pure yttrium-barium-copper oxide, and barium-copper oxide compounds including the binary systems of yttrium and neodymium, yttrium and samarium, yttrium and europium, yttrium and gadolinium, yttrium and dysprosium, and yttrium and holmium in amounts of 50 percent each by mole percent, based on total amount of rare earth elements, were prepared. The average width of the hysteresis loop for these samples was measured and plotted against the average ionic size of the two rare earth elements as shown in FIG. 5.

Figure 9:
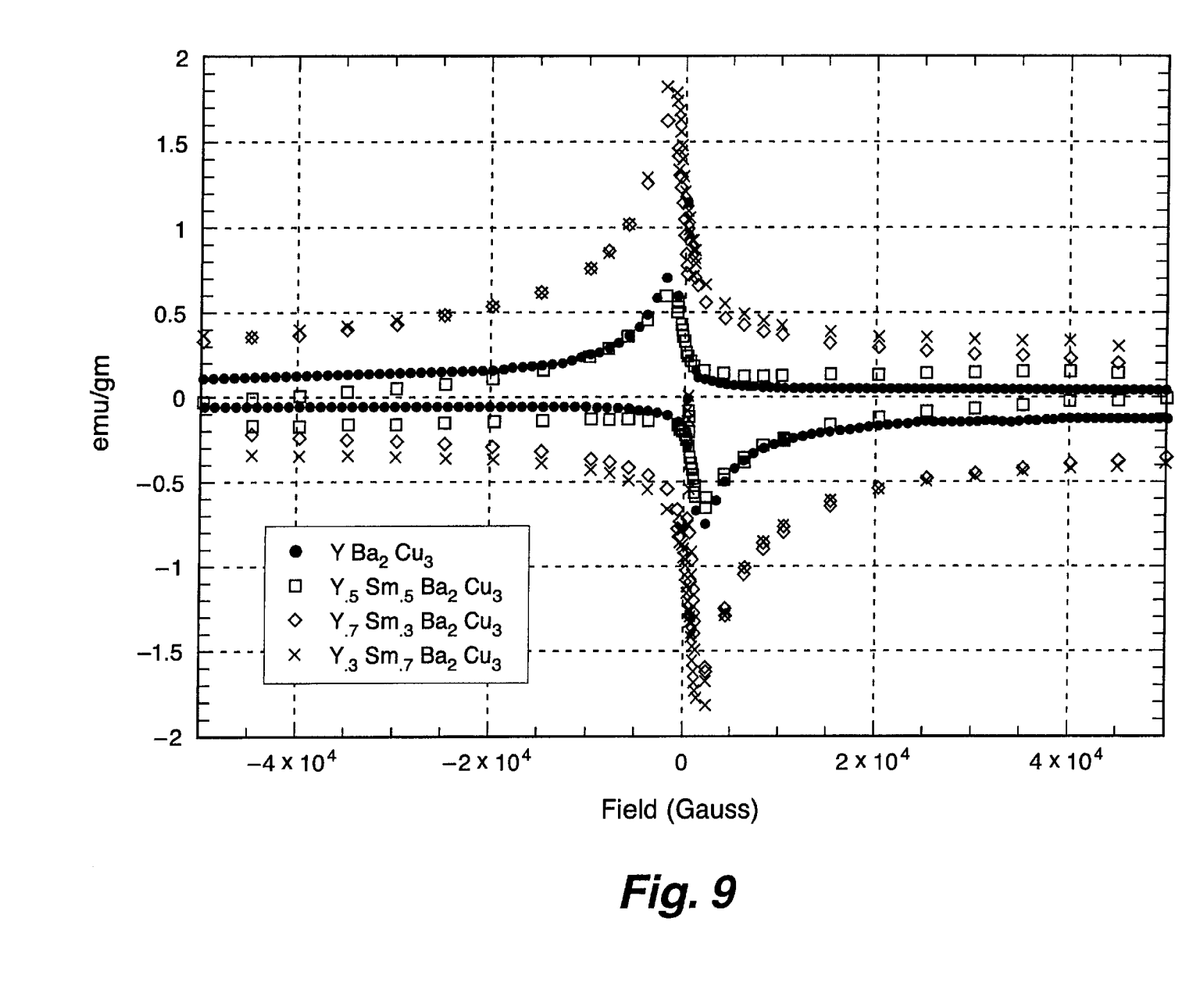
FIG. 9 shows a plot of electromotive units per gram of rare earth barium-copper oxide versus magnetic field (in gauss) for pure yttrium barium-copper oxide, and barium-copper oxide compounds including the binary system of yttrium and samarium (mole percentages of Y/Sm of 30/70; 50/50; and 70/30 based on the total amount of rare earth elements).

Bulk samples of pure yttrium barium-copper oxide, and barium-copper oxide compounds including the binary system of yttrium and samarium (mole percentages of Y/Sm of 30/70; 50/50; and 70/30 based on the total amount of rare earth elements) were prepared and measurements of hysteresis loops were made in the manner described by Bean, Reviews of Modern Physics, vol. 36, pp. 31–399(1964). The hysteresis loops (at 10K) of the pure yttrium barium-copper oxide and the barium-copper oxide compounds including the mole percentages of Y/Sm at 50/55 were found to be nearly identical. In contrast, the hysteresis loops of the barium-copper oxide compounds including the mole percentages of Y/Sm at 30/70 and 70/30 were found to be better as seen in the wider hysteresis loops shown in FIG. 9. The measurements of these hysteresis loops on the bulk materials suggests that mole percentage ratios for the rare earth elements other than 50/55 provide enhanced results.

Figure 10:
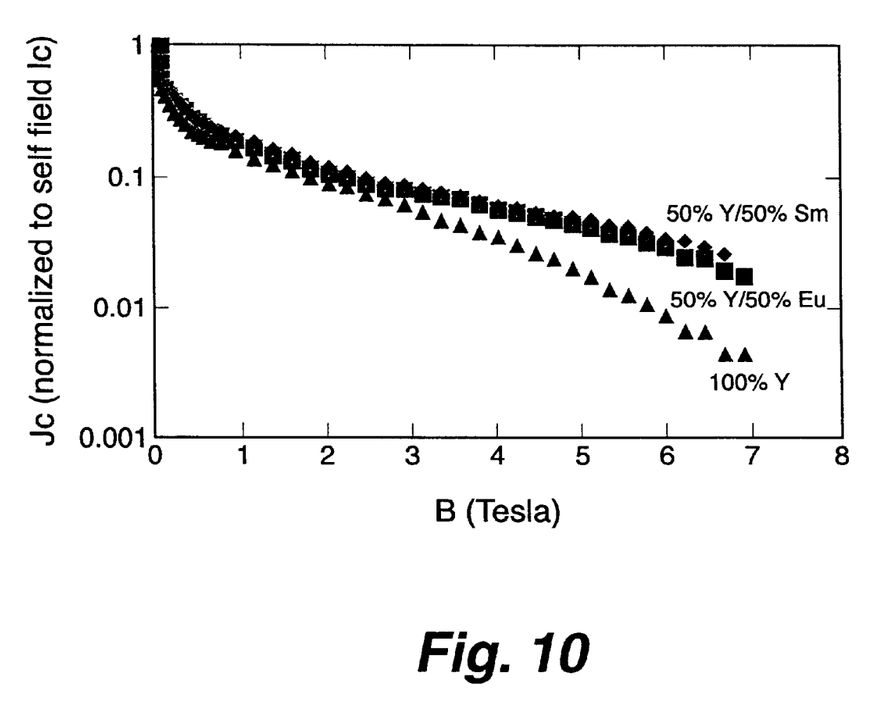
FIG. 10 shows a plot of critical current density versus magnetic field (in Tesla) for a sample of pure yttrium barium-copper oxide, and barium-copper oxide compounds including the binary system of yttrium and samarium (mole percentages of Y/Sm of 50/50 based on the total amount of rare earth elements) and the binary system of yttrium and europium (mole percentages of Y/Eu of 50/50 based on the total amount of rare earth elements).

Thin films of pure yttrium barium-copper oxide, barium-copper oxide including the binary system of yttrium and samarium (mole percentages of Y/Sm of 50/55 based on the total amount of rare earth elements) and barium-copper oxide including the binary system of yttrium and eurdpium (mole percentages of Y/Eu of 50/55 based on the total amount of rare earth elements) were deposited by pulsed laser deposition upon a substrate of Inconel 625 nickel having a first layer thereon of ion-beam assisted deposited YSZ and a second layer thereon of yttria oxide. The critical current of these thin films was measured and the plots (normalized to a self field $I_c$) are shown in FIG. 10. The slope of the plots for the pure yttrium barium-copper oxide sample versus the barium-copper oxide sample including the binary system of yttrium and samarium and the barium-copper oxide sample including the binary system of yttrium and europium indicates the samples with the mixed rare earth system maintain greater percentages of critical current under higher magnetic fields.

Figure 6:
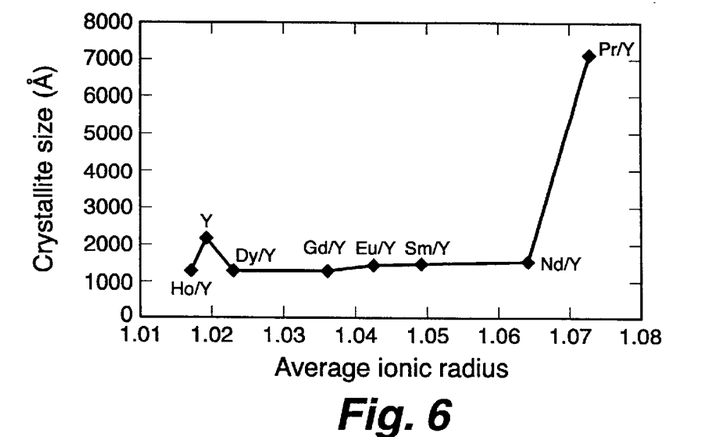
FIG. 6 shows a plot of average crystallite size in Angstroms versus the average ionic radius between a combination of rare earth element cation combinations, e.g., ($RE^1RE^2$)123 compositions.

The crystallite size in angstroms as measured by x-ray diffraction (XRD) of the bulk samples from above were measured and are plotted in FIG. 6 against the average ionic size of the two rare earth elements.

Figure 7:
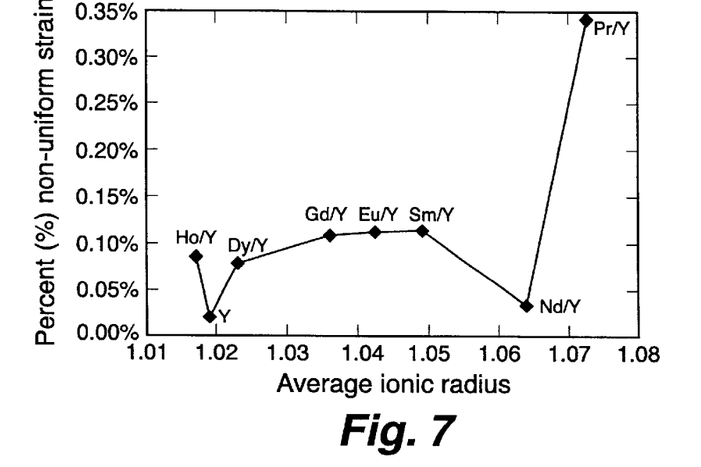
FIG. 7 shows a plot of percent non-uniform strain versus the average ionic radius between a combination of rare earth element cation combinations, e.g, ($RE^1RE^2$)123 compositions.

The non-uniform strain in percentage as measured by XRD of the bulk samples from above were measured and are plotted in FIG. 7 against the average ionic size of the two rare earth elements.

Figure 8:
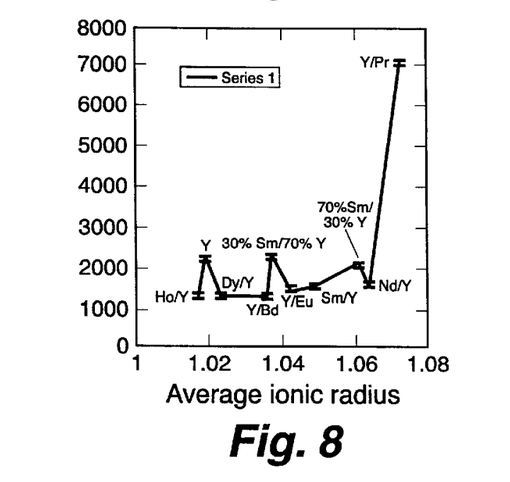
FIG. 8 shows a plot of average crystallite size in Angstroms versus the average ionic radius between a combination of rare earth element cation combinations including a combination of 70 percent yttrium/30 percent samarium (A), 50 percent yttrium/50 percent samarium (B), and 30 percent yttrium/70 percent samarium (C).

The crystallite size in angstroms as measured by XRD of the bulk samples from above were measured and are plotted in FIG. 8 against the average ionic size between a combination of rare earth element cation combinations including a combination of 70 percent yttrium/30 percent samarium (A), 50 percent yttrium/50 percent samarium (B), and 30 percent yttrium/70 percent samarium (C).

Although the present invention has been described with reference to specific details, it is not intended that such details should be regarded as limitations upon the scope of the invention, except as and to the extent that they are included in the accompanying claims.

What is claimed is:

1. A superconducting structure comprising:

a substrate;

a thin film from about 5 to 500 nm in thickness of a superconducting rare earth-barium-copper oxide thereon said substrate, said thin film being a single thin film mixture including yttrium and samarium, said single thin film mixture of superconducting material characterized as having chemical and structural compatibility with said substrate, said superconducting structure including said single thin film mixture having stronger flux pinning under magnetic fields than a single thin film of YBCO alone.

2. The structure of claim 1 wherein said substrate is a dielectric oxide of a material selected from the group consisting of lanthanum aluminum oxide, strontium titanium oxide, magnesium oxide, neodymium gadolinium oxide, and a cerium oxide/yttria-stabilized zirconia.

3. The structure of claim 1 wherein said samarium and yttrium are present in a ratio of about 50 mole percent to about 50 mole percent, on basis of total rare earth elements.

4. The structure of claim 1 wherein said substrate is a dielectric oxide of a material selected from the group consisting of lanthanum aluminum oxide, strontium titanium oxide, magnesium oxide, neodymium gadolinium oxide, and a cerium oxide/yttria-stabilized zirconia.

5. The structure of claim 1 wherein said samarium and yttrium are present in a ratio of about 30 mole percent (Sm) to about 70 mole percent (Y), on basis of total rare earth elements.

6. The structure of claim 1 wherein said samarium and yttrium are present in a ratio of about 70 mole percent (Sm) to about 30 mole percent (Y), on basis of total rare earth elements.

7. A superconducting structure comprising:

a substrate;

a thin film from about 5 to 500 nm in thickness of a superconducting rare earth-barium-copper oxide thereon said substrate, said thin film being a single thin film mixture including yttrium and europium, said single thin film mixture of superconducting material characterized as having chemical and structural compatibility with said substrate, said superconducting structure including said single thin film mixture having stronger flux pinning under magnetic fields than a single thin film of YBCO alone.

8. The structure of claim 7 wherein said europium and yttrium are present in a ratio of about 30 to 70 mole percent (Y) to about 70 to 30 mole percent (Eu), on basis of total rare earth elements.

* * * * *